United States Patent [19]
Tarleton

[11] Patent Number: 5,956,379
[45] Date of Patent: Sep. 21, 1999

[54] DIGITAL PHASE LOCK DETECTOR AND LOW-PASS FILTER SELECTOR

[75] Inventor: George Kenneth Tarleton, Phoenix, Ariz.

[73] Assignee: AG Communication Systems Corporation, Phoenix, Ariz.

[21] Appl. No.: 08/872,750

[22] Filed: Jun. 11, 1997

[51] Int. Cl.⁶ ........................................... H03D 3/24
[52] U.S. Cl. ............................ 375/376; 375/374; 331/17; 331/18; 331/25
[58] Field of Search ....................................... 375/376, 374; 327/155, 156, 159, 162, 163; 331/17, 18, 25

[56] References Cited

U.S. PATENT DOCUMENTS

| | | | |
|---|---|---|---|
| 5,420,545 | 5/1995 | Davis et al. | 331/17 |
| 5,613,235 | 3/1997 | Kivari et al. | 455/343 |
| 5,793,824 | 8/1998 | Burch et al. | 375/372 |

*Primary Examiner*—Amanda T. Le
*Assistant Examiner*—Dac V. Ha
*Attorney, Agent, or Firm*—David J. Zwick; Gregory G. Hendricks

[57] ABSTRACT

A digital phase lock detector and phase lock loop filter selector circuit implemented in hardware that dynamically selects a phase lock loop filter of appropriate bandwidth for the instant phase error condition. Phase error is primarily determined by an XOR gate receiving the PLL reference signal and the oscillator feedback signal coupled to a counter that is clocked by a high frequency signal.

10 Claims, 4 Drawing Sheets

DIGITAL PHASE LOCK DETECTOR AND LOW-PASS FILTER SELECTOR

FIELD OF THE INVENTION

This invention relates to phase lock loops, and more particularly to a digital phase lock detector and phase lock loop filter selector in a phase lock loop.

BACKGROUND OF THE INVENTION

A phase lock loop (PLL) is a circuit used to synthesize a "clean" output signal based on an input reference signal that may be noisy and jittery. The output signal will have the same long-term frequency and phase as the input signal.

The components of a typical PLL include an input reference signal, which displays a level of noise and jitter that may be unacceptable. A voltage controlled oscillator (VCO) is used to produce the PLL output signal. The input reference signal and the PLL output signal, which is carried by a feedback loop from the VCO output, are input to a phase detector which produces an error signal indicating the magnitude of the phase difference between the input reference signal and the PLL output signal. The phase error signal is integrated through a phase lock loop filter and input as a control signal to the VCO. This control signal causes the phase of the VCO output signal to converge on the phase of the input reference signal, thus minimizing the phase error.

In designing a PLL for a specific application, a decision must be made regarding the value of the bandwidth of the phase lock loop filter. A low-pass filter with a higher bandwidth will cause the VCO output signal to converge on the input reference signal more rapidly. However, the low-pass filter will be more sensitive to fluctuations in phase and frequency, and thus cause the VCO output signal to exhibit a larger degree of instability. A low-pass filter with a lower bandwidth will cause the VCO output signal to exhibit a larger degree of long-term stability, but the PLL will take longer to converge on the input reference signal when fluctuations in phase and frequency are present.

Therefore, it is desirable to have functionality incorporated into a PLL that will automatically select among a set of available phase lock loop filters the one that, for the instant situation, will most rapidly bring the VCO output signal into convergence with the input reference signal.

In the field of the present invention, i.e., digital PLLs, a known solution to providing functionality to select an appropriate phase lock loop filter is a microprocessor-controlled digital phase lock detector that determines the magnitude of the phase error and adjusts the bandwidth of the loop filter. However, a microprocessor and the firmware required to control the PLL can be too expensive a solution.

Accordingly, it is an object of the present invention to provide a relatively inexpensive circuit in hardware for use in analog or digital PLLs that will automatically generate a phase lock loop filter selection signal that is based on the magnitude of the phase error between an input reference signal and the VCO output signal.

SUMMARY OF THE INVENTION

The present invention provides a digital phase lock detector (DPLD) for use in an analog phase lock loop (PLL) or a digital phase lock loop (DPLL) that provides a control signal to be used to select a phase lock loop filter of the appropriate bandwidth. In the illustrative embodiment, the DPLD of the present invention comprises two circuits. The fast lock circuit is used to acquire initial lock and also when the digital controlled oscillator feedback signal and reference signal become greater than perfect lock ±90 degrees out of phase. When this circuit is active, the output control signal of the DPLD indicates to use the broadest bandwidth low-pass filter for fast lock acquisition. This circuit determines that the oscillator feedback signal and the reference signal are within perfect lock ±90 degrees for 256 consecutive cycles of the reference signal, and then transmits a DPLD output signal indicating that the narrow bandwidth low-pass filter should now be used to acquire and keep perfect lock. The fine adjustment circuit of the DPLD now becomes active. This circuit continues to transmit the DPLD output signal indicating that the narrow bandwidth low-pass filter should be used while the feedback signal and the reference signal are within perfect lock ±45 degrees. If the feedback signal and reference signal become greater than perfect lock ±45 degrees out of phase, the fine adjustment circuit transmits a DPLD output signal indicating that the medium bandwidth low-pass filter should be used to bring the feedback signal and the reference signal to within perfect lock ±45 degrees. The circuit then transmits the DPLD output signal indicating that the narrow bandwidth low-pass filter can again be used to acquire and keep perfect lock. Should the feedback signal and reference signal become greater than perfect lock ±90 degrees out of phase, the fast lock circuit becomes active again. The fine adjustment circuit uses a counter to determine the phase angle between the feedback signal and the reference signal. The counter is clocked by a signal that has a much higher frequency than the reference signal, and is enabled during the pulse output of an XOR gate that receives the feedback and reference signals.

DETAILED DESCRIPTION OF THE INVENTION

The illustrative embodiment of the present invention is a DPLD in a DPLL that monitors an input reference frequency and dynamically switches between three low-pass filter bandwidths of the DPLL to ensure that the DPLL output signal is on-frequency and phase-locked and free from the jitter and other perturbations of the input reference signal. The DPLD controls a DPLL that is used in a synchronized optical network (SONET) clock system. The DPLD's input reference frequency is extracted from a fiber optic signal received from another SONET node that typically is many miles away. Since the SONET input reference signal may contain high frequency jitter, low frequency phase shifts and large phase jumps due to clock rearrangements upstream, the DPLL must be able to average out these perturbations and phase jumps and supply an on-frequency jitter-free clock at its output.

In order to supply an on-frequency jitter-free clock output, the DPLL of the illustrative embodiment uses a very low bandwidth low-pass filter of approximately 0.1 Hz. The 0.1

Hz bandwidth works well under normal phase locked conditions to extract the long term frequency average from the input frequency reference signal, but may not be capable of initially acquiring lock or following small phase jumps. To initially acquire lock, a higher bandwidth low-pass filter bandwidth of approximately 10 Hz is used. The 10 Hz bandwidth is ideal for quickly acquiring lock but is too high a bandwidth to extract the long-term average frequency. Therefore, the bandwidth of the low-pass filter is switched to 0.1 Hz after phase lock is acquired. To follow small phase jumps, a low-pass filter bandwidth of approximately 1 Hz is used. The 1 Hz bandwidth works well to keep the DPLL locked during small phase jumps but is also too high a bandwidth to extract the long-term average frequency. Therefore the low-pass filter bandwidth is switched to 0.1 Hz after phase lock is established. The DPLD of the present invention determines the phase error between the input reference signal and the DPLL output signal and generates a low-pass filter selection control signal that causes the DPLL to select the appropriate low-pass filter bandwidth.

Figure 1:
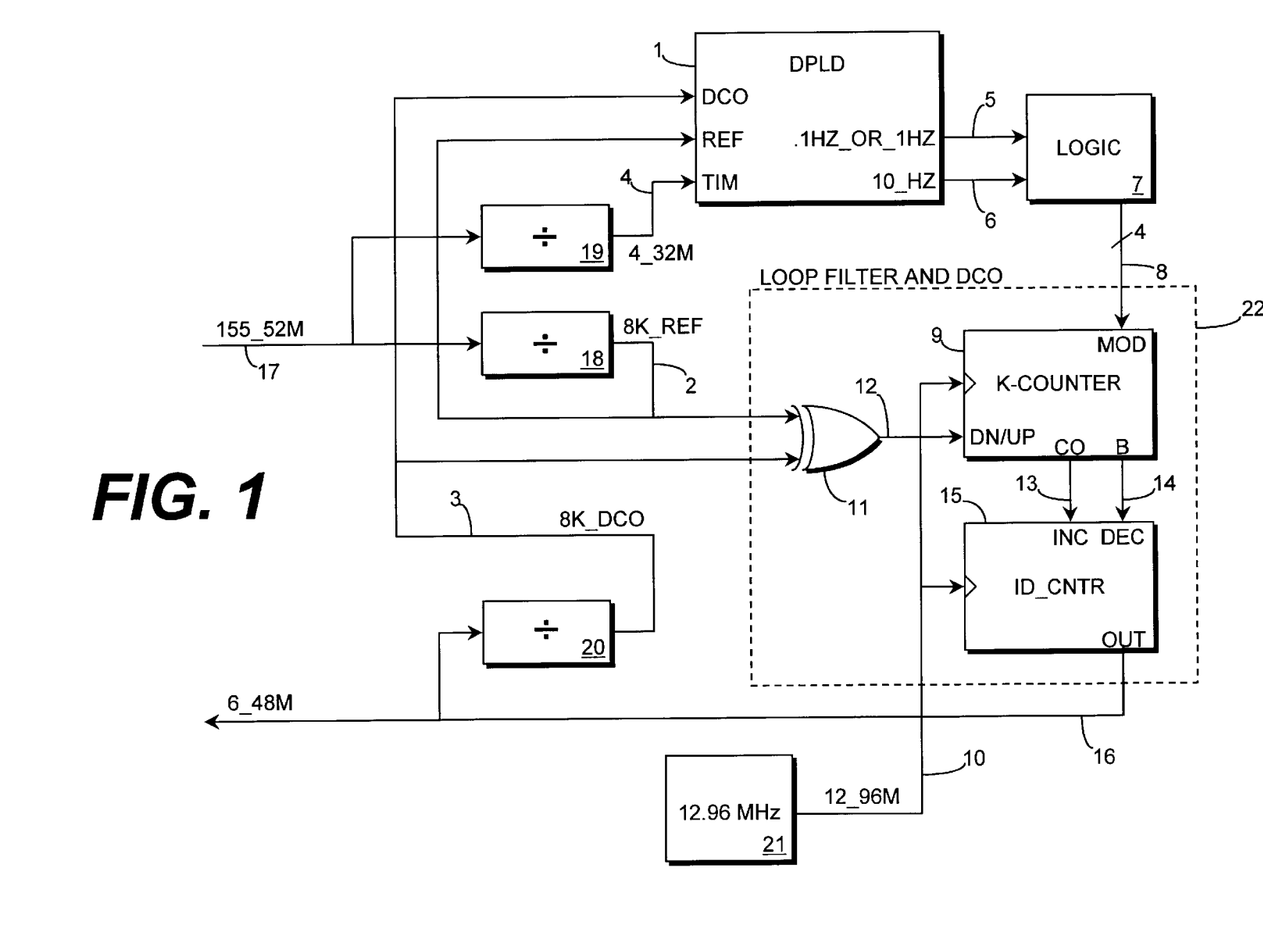
FIG. 1 shows a block diagram of the illustrative embodiment of the present invention.

FIG. 1 shows a block diagram of the DPLL of the illustrative embodiment of the present invention. Digital phase lock detector DPLD 1 receives 8 KHz reference signal 8K_REF over lead 2, 8 KHz digital controlled oscillator output signal 8K_DCO over lead 3, and 4.32 MHz DPLD counter clock signal 4_32M over lead 4. DPLD 1 transmits low-pass filter select signals 0.1HZ_OR_1HZ and 10_HZ over leads 5 and 6, respectively, to logic block 7. Logic block 7 transmits a low-pass filter control signal over lead 8 to the modulus control input of digital loop filter counter K-COUNTER 9. K-COUNTER 9 also receives a 12.96 MHz clock signal 12_96M over lead 10 and a phase angle signal from XOR gate 11 over lead 12. K-COUNTER 9 transmits a "carry" signal over lead 13 to the increment input of increment/decrement counter ID_CNTR 15, and a "borrow" signal over lead 14 to the decrement input of ID_CNTR 15. ID_CNTR 15 also receives signal 12_96M over lead 10, and transmits a 6.48 MHz DPLL output signal 6_48M over lead 16. K-COUNTER 9 and XOR gate 11 comprise the loop filter of the DPLL, and ID_CNTR 15 comprises the digital controlled oscillator. K-COUNTER 9, XOR gate 11, and ID_CNTR 15 comprise LOOP FILTER AND DCO 22.

Signals 8K_REF on lead 2 and 4_32M on lead 4 are both derived from an OC3 155.52 MHz line signal 155_52M on lead 17 from another SONET system, and are divided down by frequency dividers 18 and 19, respectively. Signal 8K_DCO on lead 3 is derived from ID_CNTR output signal 6_48M on lead 16 and is divided down by frequency divider 20. Signal 12_96M on lead 10 is generated by a 12.96 MHz oscillator 21.

In operation, signal 155_52M on lead 17 is the external reference signal for the DPLL. Signal 155_52M is divided down by frequency divider 18 and is presented to DPLD 1 as signal 8K_REF on lead 2. Signal 6_48M on lead 16 from ID_CNTR 15 is the output signal of the DPLL, and is divided down by frequency divider 20 and is presented to DPLD 1 as signal 8K_DCO on lead 3. DPLD 1 measures the phase angle between signals 8K_REF and 8K_DCO and, based upon predetermined phase angle values, asserts low-pass filter control signals 10_HZ and 0.1HZ_OR_1HZ. Signals 10_HZ and 0.1HZ_OR_1HZ are transmitted to logic control block 7, which transmits a signal in the proper format to the modulus control input of K-COUNTER 9. The modulus of K-COUNTER 9 controls the digital loop filter bandwidth.

LOOP FILTER AND DCO 22 of the present invention preferably comprises a Signetics, Inc. model 74HCT297 Digital Phase-Locked Loop Filter. Detailed information on the specifications, use and operation of the 74HCT297 are contained in Signetics publication "74HCT297 Phase-Locked Loop Filter," 1988. In overview, the operation of K-COUNTER 9 is controlled by the down/up signal received on lead 12 from XOR gate 11. XOR gate 11 acts as a phase detector, with the duty cycle of its output signal dependent on the phase relationship of its two input signals 8K_REF and 8K_DCO. When signal 8K_DCO leads signal 8K_REF by 90 degrees, the DPLL is in perfect lock, and the output signal of XOR gate 11 will be a pulse train having a duty cycle of 50%. If signal 8K_DCO leads signal 8K_REF by more than 90 degrees, then the output signal of XOR gate 11 will be a pulse train with greater logic "1" pulse widths. If signal 8K_DCO leads signal 8K_REF by less than 90 degrees, then the output signal of XOR gate 11 will be a pulse train with greater logic "0" pulse widths.

K-COUNTER 9 has two counters: an up-counter that is active while the output signal of XOR gate 11 is low, and a down-counter that is active while the output signal of XOR gate 11 is high. Both counters are clocked by signal 12_96M on lead 10. Both counters have the same modulus "k" that is controlled by the output signal of logic control block 7 on lead 8, received at the modulus control input of K-COUNTER 9. Both counters roll over to zero when their counts exceed k-1. The most significant bit of the up-counter is output on carry lead 13, and the most significant bit of the down-counter is output on borrow lead 14. When the DPLL is in perfect lock, the pulse count of the carry-out signal will be the same as that of the borrow signal. If signal 8K_DCO leads signal 8K_REF by more than 90 degrees, then the pulse count of the borrow signal will be greater than that of the carry signal. If signal 8K_DCO leads signal 8K_REF by less than 90 degrees, then the pulse count of the carry signal will be greater than that of the borrow signal. Larger phase errors result in larger pulse count differences between the carry and borrow signals. Higher values of modulus k decrease the pulse frequencies of both the carry and borrow signals.

Digital controlled oscillator ID_CNTR 15 is a counter that is clocked by signal 12_96M on lead 10, and outputs signal 6_48M on lead 16 that has a frequency equal to half that of the input clock signal. A pulse on increment input lead 13 causes ID_CNTR 15 to add a pulse to output signal 6_48M, and a pulse on decrement input lead 14 causes ID_CNTR 15 to delete a pulse from output signal 6_48M. Thus, when signal 8K_DCO leads signal 8K_REF by more than 90 degrees, LOOP FILTER AND DCO 22 operates to decrease the frequency of signal 8K_DCO until the signals are in lock, and when signal 8K_DCO leads signal 8K_REF by less than 90 degrees, LOOP FILTER AND DCO 22 operates to increase the frequency of signal 8K_DCO until the signals are in lock. Decreasing the value of modulus k corresponds to increasing the bandwidth of the low-pass filter of a DPLL. Because DPLL output signal 6_48M is inherently jittery, it may be processed by an analog PLL before further use.

In the illustrative embodiment, a clock signal for ID_CNTR 15 of 12.96 MHz was chosen based on frequency constraints of the model 74HCT297 Digital Controlled Oscillator. A frequency of 8 KHz was chosen for the frequencies of DPLD input signals 8K_DCO and 8K_REF in order to achieve the desired loop time constant, as explained in the aforementioned data sheet.

Figure 2A:
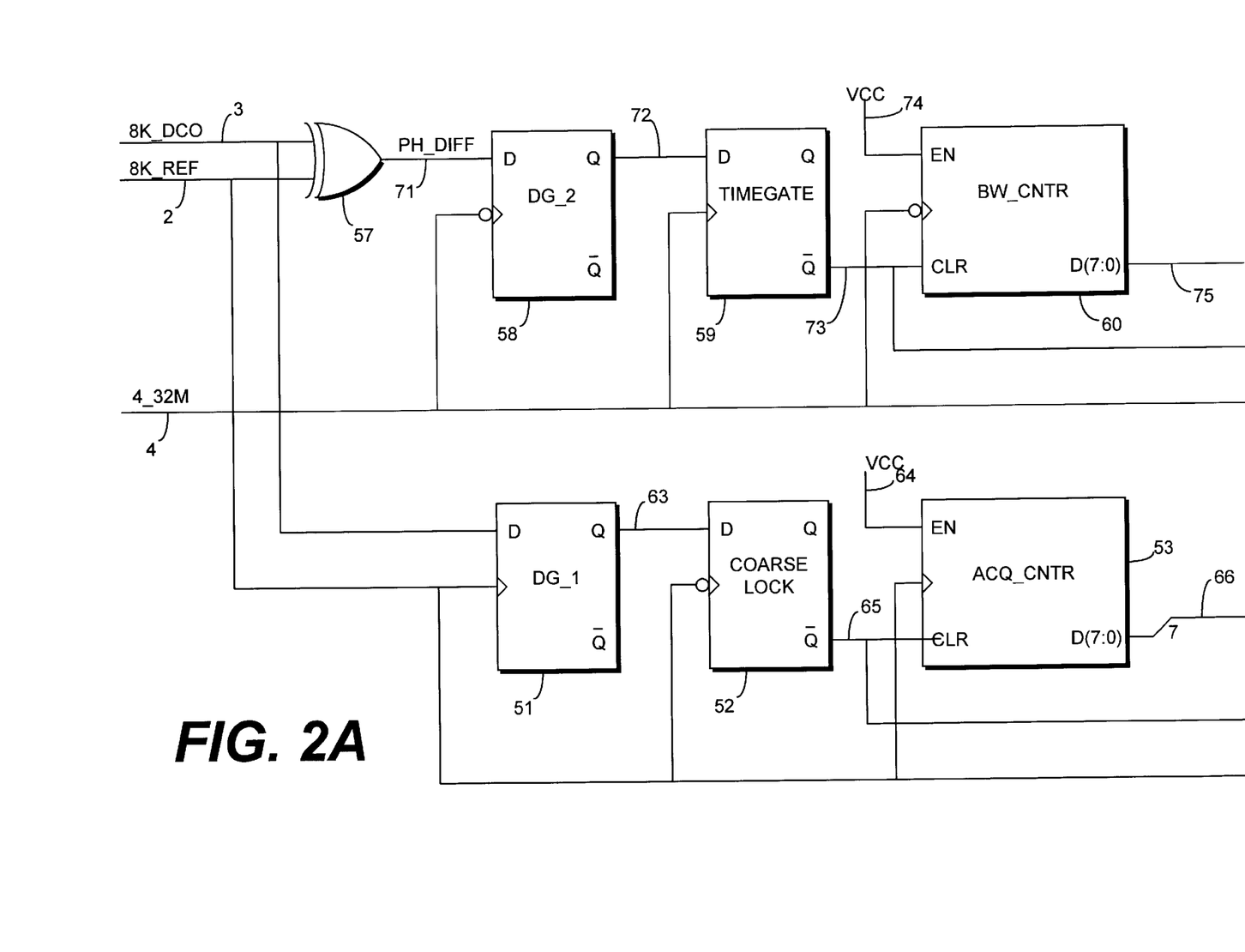
FIGS. 2A and 2B show a logic diagram of the digital phase lock detector of the present invention.
Figure 2B:
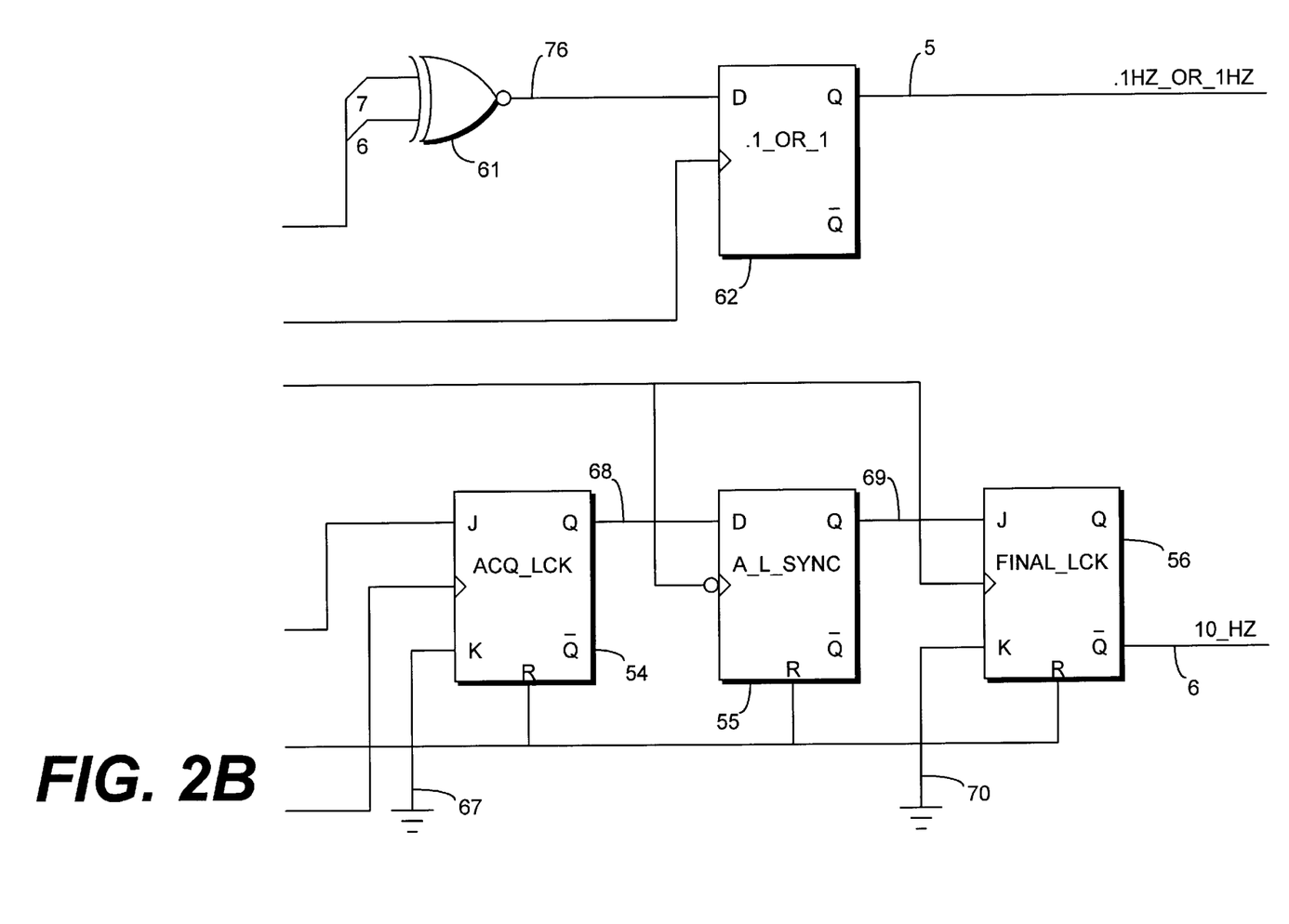

FIGS. 2A and 2B show a logic diagram of the illustrative embodiment of the digital phase lock detector and low-pass filter bandwidth selector circuit DPLD 1 of the present invention. DPLD 1 comprises two measuring circuits: a fast lock circuit and a fine adjustment circuit. The fast lock circuit comprises a first deglitch flip-flop DG_1 51, coarse lock detector flip-flop COARSE_LOCK 52, 256-bit lock acquisition counter ACQ_CNTR 53, acquired lock flip-flop ACQ_LCK 54, acquired lock synchronizer flip-flop A_L_SYNC 55, and final lock flip-flop FINAL_LCK 56. The fine adjustment circuit comprises XOR gate 57, a second deglitch flip-flop DG_2 58, time gate flop-flop TIMEGATE 59, bandwidth select counter BW_CNTR 60, XNOR gate 61, and 0.1 Hz or 1 Hz bandwidth selector flip-flop 0.1_OR_1 62.

8 KHz Signal 8K_DCO, derived from output signal 6_48M from ID_CNTR 15, is received at the D input of flip-flop DG_1 51 over lead 3, and 8 KHz signal 8K_REF, derived from DPLL external reference signal 155_52M on lead 17, is received at the positive-edge triggered clock input of flip-flop DG_1 51 over lead 2. The Q output of flip-flop DG_1 51 is received at the D input of flip-flop COARSE_LOCK 52 over lead 63. Signal 8K_REF is received at the negative-edge triggered clock input of flip-flop COARSE_LOCK 52 over lead 2. Counter ACQ_CNTR 53 receives a constant positive voltage signal at counter enable input EN over lead 64. The Q-complement output of flip-flop COARSE_LOCK 52 is received by counter ACQ_CNTR 53 at its CLR input over lead 65. Bit 7 of the 8-bit counter output signal on lead 66 is received by the J input of flip-flop ACQ_LCK 54. Flip-flop ACQ_LCK 54 also receives at its K input a constant ground voltage signal over connection 67, and receives signal 8K_REF at its positive-edge triggered clock input over lead 2, and further receives at its asynchronous reset input the Q-complement output signal of flip-flop COARSE_LOCK 52 over lead 65. The Q output of flip-flop ACQ_LCK 54 is received by the D input of flip-flop A_L_SYNC 55 over lead 68. Flip-flop A_L_SYNC 55 also receives signal 4_32M, derived from DPLL external reference signal 155_52M, over lead 4 at its negative-edge triggered clock input, and receives at its asynchronous reset input the Q-complement output signal from flip-flop COARSE_LOCK 52 over lead 65. The Q output of flip-flop A_L_SYNC 55 is received by the J input of flip-flop FINAL_LCK 56 over lead 69. The K input of flip-flop FINAL_LCK 56 receives a constant ground voltage signal over connection 70, and receives at its asynchronous reset input the Q-complement output signal from flip-flop COARSE_LOCK 52 over lead 65. Signal 10_HZ is transmitted on the Q-complement output of flip-flop FINAL_LCK 56 over lead 6.

XOR gate 57 receives signal 8K_DCO over lead 3 and signal 8K_REF over lead 2. Output signal PH_DIFF from XOR gate 57 is received by flip-flop DG_2 58 at its D input over lead 71. Flip-flop DG_2 58 also receives signal 4_32M at its negative-edge triggered clock input over lead 4. The Q output of flip-flop DG_2 58 is received by the D input of flip-flop TIMEGATE 59 over lead 72. Flip-flop TIMEGATE 59 also receives signal 4_32M at its positive-edge triggered clock input over lead 4. The Q-complement output of flip-flop TIMEGATE 59 is received at the CLR input of counter BW_CNTR 60 over lead 73. Counter BW_CNTR 60 also receives a constant positive voltage at its counter enable input EN over lead 74, and signal 4_32M at its negative-edge triggered clock input over lead 4. Bits (7:6) of the 8-bit counter output signal on lead 75 are received by XNOR gate 61. Flip-flop 0.1_OR_1 62 receives the output signal of XNOR gate 61 at its D input over lead 76, and receives the Q-complement output of flip-flop TIMEGATE 59 at its positive-edge triggered clock input over lead 73. The Q output of flip-flop 0.1_OR_1 62 transmits DPLD 1 output signal 0.1HZ_OR_1HZ on lead 5.

Not shown in FIGS. 2A and 2B are power-up and system asynchronous reset signals to flip-flops DG_1 51, COARSE_LOCK 52, DG_2 58, TIMEGATE 59, and 0.1_OR_1 62.

The fast lock circuit of DPLD 1 indicates that the phase angle between signals 8K_DCO and 8K_REF is between 0 and π radians, and has stayed so for a predetermined number of 8K_REF cycles. In the fast lock circuit of DPLD 1, flip-flop DG_1 51 receives signal 8K_DCO at its D input over lead 3, and signal 8K_REF at its clock input over lead 2. While signal 8K_DCO leads signal 8K_REF by $0<\Phi\leq\pi$, where $\Phi$ is the phase angle between signals 8K_DCO and 8K_REF, a logic "1" will be clocked into flip-flop DG_1 51 at each leading edge of signal 8K_REF. This logic "1" is clocked into flip-flop COARSE_LOCK 52 over lead 63 at each trailing edge of signal 8K_REF. This arrangement of flip-flops 51 and 52 will be recognized as a common method to clock a glitch-free input signal into flip-flop 52, and is used elsewhere in the DPLD circuit of the present invention.

While flip-flop COARSE_LOCK 52 is receiving a logic "1" from flip-flop DG_1 51, the Q-complement output signal of flip-flop COARSE_LOCK 52 asserted on the CLR input of counter ACQ_CNTR 53 over lead 65 will be a logic "0", allowing counter ACQ_CNTR 53 to increment with each leading edge of signal 8K_REF received by counter ACQ_CNTR 53 over lead 2. When counter ACQ_CNTR 53 reaches a count of 256, bit 7 of the counter output signal on lead 66 is asserted, and signals 8K_DCO and 8K_REF are considered to be in coarse lock. A counter value of 256 for counter ACQ_CNTR 53 was chosen based on the period of signal 8K_REF and a desired interval to allow the DPLL to converge to a phase locked condition using the broad low-pass filter bandwidth. If signal 8K_DCO leads signal 8K_REF by $\pi<\Phi\leq 2\pi$, the Q-complement output signal of flip-flop COARSE_LOCK 52 asserted on the CLR input of counter ACQ_CNTR 53 will be a logic "1", causing ACQ_CNTR 53 to reset to zero until signal 8K_DCO again leads signal 8K_REF by $0<\Phi\leq\pi$.

Figure 3:
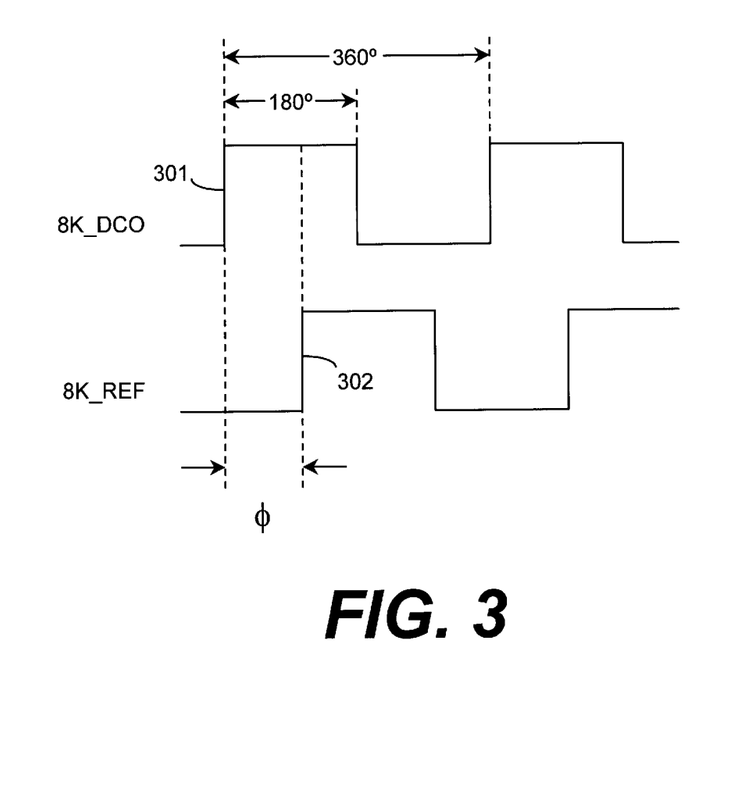
FIG. 3 shows a first timing diagram of selected signals present in the digital phase lock detector of the present invention.

FIG. 3 shows a timing diagram illustrating the phase relationship governing coarse lock. Phase angle $\Phi$ is defined by leading edge 301 of signal 8K_DCO and leading edge 302 of signal 8K_REF. While $0<\Phi\leq\pi$, leading edge 302 of signal 8K_REF will clock signal 8K_DCO into flip-flip DG_1 51 while signal 8K_DCO has a value of logic "1". If $\pi<\Phi\leq 2\pi$, leading edge 302 of signal 8K_REF will clock signal 8K_DCO into flip-flip DG_1 51 while signal 8K_DCO has a value of logic "0", causing counter ACQ_CNTR 53 to reset.

Referring again to FIGS. 2, bit 7 of the counter output signal from counter ACQ_CNTR 53 over lead 66 is received by the J input of flip-flop ACQ_LCK 54. When bit 7 of the counter output signal goes to "1" at a counter value 256, it is clocked into flip-flop ACQ_LCK 54 at the next leading edge of signal 8K_REF. The Q output of flip-flop ACQ_LCK 54 is then clocked into flipflop A_L_SYNC 55 at the next trailing edge of signal 4_32M and appears on the Q output lead 69, where it is then clocked into flip-flop FINAL_LCK 56 at the next leading edge of signal 4_32M, and then appears as a "0" on the Q-complement output of flip-flop FINAL_LCK 56 on lead 6 as signal 10_HZ. Signal 10_HZ will remain at logic "1" after coarse lock has been established and while signal 8K_DCO leads signal 8K_REF by $0<\Phi\leq\pi$. If phase angle $\Phi$ falls outside this range, flip-flops ACQ_LCK 54, A_L_SYNC 55 and FINAL_LCK 56 will be reset by the Q-complement signal of flip-flop COARSE_LOCK 52 on lead 65 causing signal 10_HZ to go to "1". Signal 10_HZ will remain at "1" until coarse lock is again established by counter ACQ_CNTR 53.

When signal 10_HZ changes to a value of logic "0", it indicates that the DPLL has had sufficient time to converge on phase lock using the broad low-pass filter, and the two narrow low-pass filters may now be used to fine adjust the DPLL to perfect lock.

In the fine adjustment circuit of the DPLD 1, XOR gate 57 receives signal 8K_DCO over lead 3, and signal 8K_REF over lead 2. Output signal PH_DIFF from XOR gate 57 on lead 71 will have pulses with a pulse width corresponding to the phase difference between signals 8K_DCO and 8K_REF, and will have a 50% duty cycle when the DPLL is perfectly locked, i.e., signal 8K_DCO leads signal 8K_REF by exactly 90 degrees.

As signal 8K_DCO leads signal 8K_REF by phase angles from 0 to π, signal PH_DIFF over lead 71 will have duty cycles starting at zero and increasing to 100%. While signal PH_DIFF has a value of logic "1", a logic "1" will be clocked into flip-flop DG_2 58 at each trailing edge of 4.32 MHz signal 4_32M. This logic "1" is clocked into flip-flop TIMEGATE 59 over lead 72 at each leading edge of signal 4_32M, causing the Q-complement output of flip-flop TIMEGATE 59 to assert a logic "0" at the CLR input of counter BW_CNTR 60 over lead 73 and allowing counter BW_CNTR 60 to increment at each trailing edge of signal 4_32M. When signal PH_DIFF goes to "0", the Q-complement output of flip-flop TIMEGATE 59 goes to "1" at the CLR input of counter BW_NTR 60, causing the counter to clear.

Figure 4:
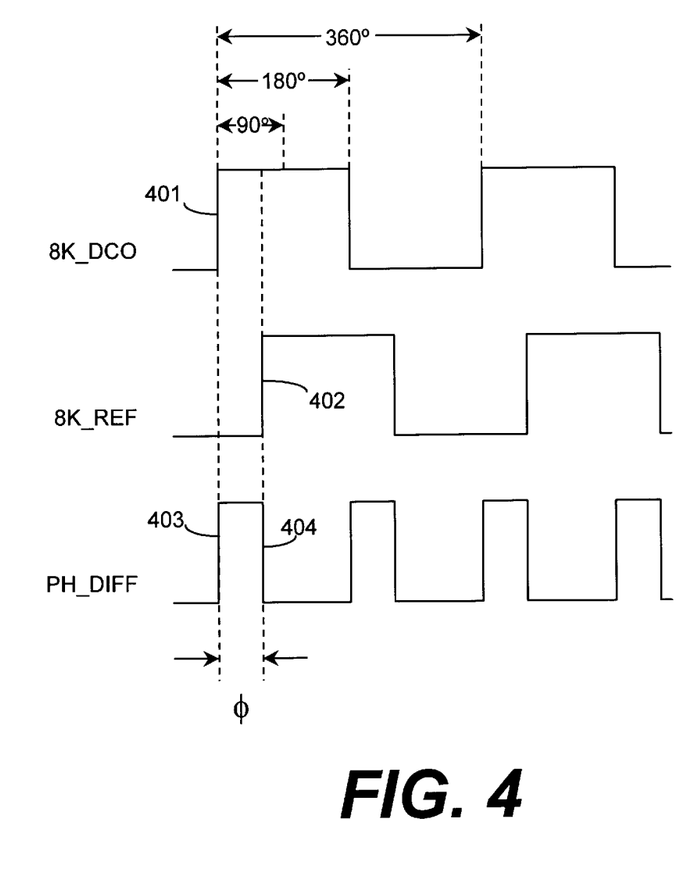
FIG. 4 shows a second timing diagram of selected signals present in the digital phase lock detector of the present invention.

FIG. 4 shows a timing diagram illustrating the phase relationship governing the control of counter BW_NTR 60. Phase angle Φ is defined by leading edge 401 of signal 8K_DCO and leading edge 402 of signal 8K_REF. Signal PH_DIFF from XOR gate 57 has pulses defined by a leading edge 403 and trailing edge 404 having width corresponding to phase angle Φ. Leading edge 403 causes the Q-complement signal of flip-flip TIMEGATE 59 on lead 73 to go to "0", allowing counter BW_NTR 60 to increment at each trailing edge of signal 4_32M. Trailing edge 404 causes the Q-complement signal of flip-flip TIMEGATE 59 on lead 73 to go to "1", clearing counter BW_CNTR 60. The value of counter BW_NTR 60 attained just prior to clearing is indicative of phase angle Φ.

It can be seen that as signal 8K_DCO leads signal 8K_REF by phase angles from π to 2π, signal PH_DIFF over lead 71 will have duty cycles starting at 100% and decreasing to zero. Thus, a value of counter BW_NTR 60 will usually represent two phase angles centered about π. In applications where the value of the phase angle from 0 to 2π is desired, the Q output signal of flip-flop DG_1 51, or another appropriate downstream signal of the fast lock circuit, in conjunction with the value of the counter output signal of counter BW_NTR 60 may be used.

Referring again to FIGS. 2, XNOR gate 61 receives bits (7:6) of the 8-bit counter output signal of counter BW_NTR 60 on lead 75. The output signal from XNOR gate 61 over lead 76 will have a value of logic "0" when counter BW_NTR 60 has values between 64 and 191, inclusive. These values correspond to pulse widths for signal PH_DIFF of between about 14.8 usec and 44.2 usec, which corresponds to a phase angle between 8 Khz signals 8K_DCO and 8K_REF of about 43 degrees to 127 degrees, or roughly perfect lock ±45 degrees.

The instantaneous value of the output signal from XNOR gate 61 over lead 76 is clocked into flip-flop 0.1_OR_1 62 when the Q-complement output signal of flip-flip TIMEGATE 59 goes to "1", which occurs at each trailing edge 404 of signal PH_DIFF.

Thus, the value of flip-flop 0.1OR_1 62 will be "0" if the phase angle between signals 8K_DCO and 8K_REF is within roughly 90±45 degrees, and "1" if the phase angle is outside this range. A value of "1" for signal 0.1HZ_OR_1HZ on Q output lead 5 of flip-flop 0.1_OR_1 62 indicates to use the 1 Hz low-pass filter to acquire phase lock, and a value of "0" indicates to use the 0.1 Hz low-pass filter to acquire phase lock.

As stated above, if the phase angle between signals 8K_DCO and 8K_REF is outside the 90±45 degrees range, but still within the 90±90 degrees range, a "1" will be clocked into flip-flop 0.1_OR_1 62 at the trailing edges of the pulses of signal PH_DIFF, indicating that the slightly broader 1 Hz low-pass filter is needed to bring the DPLL back into lock. When the phase angle between signals 8K_DCO and 8K_REF is again within the 90±45 degrees range, a "0" will be clocked into flip-flop 0.1 OR 1 62 at the trailing edges of the pulses of signal PH DIFF, indicating that the 0.1 Hz low-pass filter is to be used to bring the DPLL back into perfect lock. A value of "1" for signal 10_HZ on lead 6 will override signal 0.1HZ_OR_1HZ and will force the DPLL to use the 10 Hz low-pass filter of the fast lock circuit to acquire lock.

While only one illustrative embodiment is disclosed herein, it will be apparent to those skilled in the art that a DPLD incorporating the inventive concepts disclosed herein can be designed to include any desired number of phase angle range detectors, each with an associated phase angle range and an "in-range/out-of-range" output signal, through a judicious choice for the frequency of the counter timing signal of counter BW_NTR 60 and appropriate combinatorial logic acting on the counter output signal of counter BW_NTR 60.

While the inventive system has been particularly shown and described, it is not intended to be exhaustive nor to limit the invention to the embodiment disclosed. It will be apparent to those skilled in the art that modifications can be made to the present invention without departing from the scope and spirit thereof. It is intended that the scope of the invention be defined by the claims appended hereto and their equivalents.

What is claimed is:

1. A digital phase detector circuit for use in a phase lock loop system having a source of a reference signal of first and second characteristics, a source of an oscillator signal of first and second characteristics, and a source of counter timing pulses of first and second characteristics, said digital phase detector circuit comprising:

a combinatorial circuit to generate a phase pulse having a pulse width corresponding to a phase difference between said reference signal and said oscillator signal, and operated in response to said reference signal of said first characteristic and said oscillator signal of said second characteristic, or said reference signal of said second characteristic and said oscillator signal of said first characteristic to generate said phase pulse of a first characteristic, and further operated in response to said reference signal of said first characteristic and said oscillator signal of said first characteristic, or said reference signal of said second characteristic and said oscillator signal of said second characteristic to generate said phase pulse of a second characteristic;

a first counter circuit operated to count said counter timing pulses for the duration of said phase pulse to generate a digital phase value signal corresponding to said pulse width, said digital phase value signal comprising a plurality of bits, each of said bits corresponding to a power of two component of the value of said phase value signal; and a filter bandwidth selection circuit responsive to said digital phase value signal to generate one or more filter bandwidth selection signals;

wherein said filter bandwidth selection signals are operative to select an appropriate phase lock loop filter to urge said phase lock loop system to converge to phase lock.

2. The digital phase detector circuit of claim 1 wherein said combinatorial circuit further comprises an XNOR gate.

3. The digital phase detector circuit of claim 1, wherein said first counter circuit is further operated in response to said phase pulse of said first characteristic and each of said counter timing pulses changing from said second characteristic to said first characteristic to increment a first counter value, and further operated to generate said phase value signal, said value of said phase value signal corresponding to said first counter value, and further operated in response to said phase pulse of said second characteristic to clear said first counter value.

4. The digital phase detector circuit of claim 1, wherein said filter bandwidth selection circuit comprises:

one or more phase value range detection circuits responsive to said phase value signal to generate one or more associated phase range signals of a first characteristic when the value of said phase value signal is between an associated lower predetermined phase value and an associated upper predetermined phase value, and said one or more phase value range detection circuits further responsive to said phase value signal to generate said one or more associated phase range signals of a second characteristic when said value of said phase value signal is not between said associated lower predetermined phase value and said associated upper predetermined phase value; and one or more first storage circuits, each of said first storage circuits associated with one of said phase value range detection circuits, each of said first storage circuits responsive to said phase pulse changing from said first characteristic to said second characteristic and said associated phase range signal of said first characteristic to generate one of said one or more filter bandwidth selection signals of a first characteristic, and each of said first storage circuits further responsive to said phase pulse changing from said first characteristic to said second characteristic and said associated phase range signal of said second characteristic to generate said one of said one or more filter bandwidth selection signals of a second characteristic.

5. The digital phase detector circuit of claim 4, wherein each of said phase value range detection circuits further comprises a combinatorial circuit responsive to one or more of said bits of said phase value signal to generate one of said phase range signals, wherein said one or more bits correspond to said associated lower predetermined phase value and said associated upper predetermined phase value.

6. The digital phase detector circuit of claim 1, further comprising a phase radian indicator circuit responsive to said reference signal and said oscillator signal to generate a radian indicator signal of a first characteristic when said phase difference is between approximately 0 and $\pi$, and further responsive to said oscillator signal and said reference signal to generate said radian indicator signal of a second characteristic when said phase difference is between approximately $\pi$ and $2\pi$.

7. The digital phase detector circuit of claim 6, wherein said phase radian indicator circuit comprises:

a second storage circuit operated in response to said reference signal changing from said second characteristic to said first characteristic and said oscillator signal of said first characteristic to generate said radian indicator signal of a first characteristic, and further operated in response to said reference signal changing from said second characteristic to said first characteristic and said oscillator signal of said second characteristic to generate said radian indicator signal of a second characteristic.

8. The digital phase detector circuit of claim 6, wherein said phase radian indicator circuit comprises:

a second storage circuit operated in response to said reference signal changing from said second characteristic to said first characteristic and said oscillator signal of said first characteristic to generate a phase difference signal of a first characteristic, and further operated in response to said reference signal changing from said second characteristic to said first characteristic and said oscillator signal of said second characteristic to generate said phase difference signal of a second characteristic; and a second counter circuit operated in response to said phase difference signal of said first characteristic and said reference signal changing from said first characteristic to said second characteristic to increment a second counter value, and further operated in response to said phase difference signal of said second characteristic to clear said second counter value, and further operated to generate said radian indicator signal of a first characteristic when said counter value is equal to or greater than a predetermined counter value, and further operated to generate said radian indicator signal of a second characteristic when said counter value is less than said predetermined counter value.

9. A digital phase lock detector circuit for use in a phase lock loop system having a source of a reference signal of first and second characteristics having a first frequency, a source of an oscillator signal of first and second characteristics, and a source of counter timing pulses of first and second characteristics having a second frequency higher than said first frequency, said digital phase lock detector circuit comprising:

a first phase detector circuit operated in response to said reference signal of said first characteristic and said oscillator signal of said second characteristic, or said reference signal of said second characteristic and said oscillator signal of said first characteristic, to generate a first phase detector output signal of a first characteristic, and further operated in response to said reference signal of said first characteristic and said oscillator signal of said first characteristic, or said reference signal of said second characteristic and said oscillator signal of said second characteristic, to generate a first phase detector output signal of a second characteristic;

a first storage circuit operated in response to one of said counter timing pulses changing from said first characteristic to said second characteristic and said first phase detector output signal of said first characteristic to generate a first storage circuit output signal of a first characteristic, and further operated in response to one of said counter timing pulses changing from said first characteristic to said second characteristic and said first phase detector output signal of said second characteristic to generate said first storage circuit output signal of a second characteristic;

a second storage circuit operated in response to one of said counter timing pulses changing from said second characteristic to said first characteristic and said first storage circuit output signal of said first characteristic to generate a second storage circuit output signal of a first characteristic, and further operated in response to one of said counter timing pulses changing from said second characteristic to said first characteristic and said first storage circuit output signal of said second characteristic to generate said second storage circuit output signal of a second characteristic;

a first counter circuit operated in response to each of said counter timing pulses changing from said first characteristic to said second characteristic and said second storage circuit output signal of said first characteristic to increment a first counter value of said first counter, and further operated in response to said second storage circuit output signal of said second characteristic to clear said first counter value, and further operated to generate a first counter circuit output signal comprising a plurality of bits, each of said bits corresponding to a power of two component of said first counter value;

a combinatorial circuit responsive to one or more of said bits of said first counter circuit output signal to generate a combinatorial circuit output signal of a first characteristic when said first counter value is between a first predetermined first counter value and a second predetermined first counter value, and further operated to generate said combinatorial circuit output signal of a second characteristic when said first counter value is not between said first predetermined first counter value and said second predetermined first counter value; and a third storage circuit operated in response to said second storage circuit output signal changing from said first characteristic to said second characteristic and said combinatorial circuit output signal of said first characteristic to generate a filter bandwidth selection signal of a first characteristic, and further operated in response to said second storage circuit output signal changing from said first characteristic to said second characteristic and said combinatorial circuit output signal of said second characteristic to generate a filter bandwidth selection signal of a second characteristic.

10. The digital phase lock detector circuit of claim 9, further comprising:

a fourth storage circuit operated in response to said reference signal changing from said second characteristic to said first characteristic and said oscillator signal of said first characteristic to generate a fourth storage circuit output signal of a first characteristic, and further operated in response to said reference signal changing from said second characteristic to said first characteristic and said oscillator signal of said second characteristic to generate said fourth storage circuit output signal of a second characteristic;

a fifth storage circuit operated in response to said reference signal changing from said first characteristic to said second characteristic and said fourth storage circuit output signal of said first characteristic to generate a fifth storage circuit output signal of a first characteristic, and further operated in response to said reference signal changing from said first characteristic to said second characteristic and said fourth storage circuit output signal of said second characteristic to generate said fifth storage circuit output signal of a second characteristic;

a second counter circuit operated in response to said reference signal changing from said second characteristic to said first characteristic and said fifth storage circuit output signal of said second characteristic to increment a second counter value of said second counter, and further operated in response to said fifth storage circuit output signal of said first characteristic to clear said second counter value, and further operated to generate a second counter circuit output signal comprising a plurality of bits of first and second characteristics, each of said bits corresponding to a power of two component of said second counter value;

a sixth storage circuit operated in response to said reference signal changing from said second characteristic to said first characteristic and said fifth storage circuit output signal of said second characteristic and a predetermined one of said bits of said second counter circuit output signal of a first characteristic, said predetermined one of said bits corresponding to a predetermined second counter value, to generate a sixth storage circuit output signal of a first characteristic when said second counter value is equal to said predetermined second counter value, and further operated in response to said fifth storage circuit output signal of said first characteristic to generate said sixth storage circuit output signal of a second characteristic;

a seventh storage circuit operated in response to said counter timing signal changing from said first characteristic to said second characteristic and said fifth storage circuit output signal of said second characteristic and said sixth storage circuit output signal of said first characteristic to generate a seventh storage circuit output signal of a first characteristic, and further operated in response to said counter timing signal changing from said first characteristic to said second characteristic and said fifth storage circuit output signal of said second characteristic and said sixth storage circuit output signal of said second characteristic to generate said seventh storage circuit output signal of a second characteristic, and further operated in response to said fifth storage circuit output signal of said first characteristic to generate said seventh storage circuit output signal of said second characteristic; and an eighth storage circuit operated in response to said counter timing signal changing from said second characteristic to said first characteristic and said fifth storage circuit output signal of said second characteristic and said seventh storage circuit output signal of said first characteristic to generate a radian indicator signal of a first characteristic, and further operated in response to said fifth storage circuit output signal of said first characteristic to generate said radian indicator signal of a second characteristic.

* * * * *